US007811839B2

(12) United States Patent
Kasahara et al.

(10) Patent No.: US 7,811,839 B2
(45) Date of Patent: Oct. 12, 2010

(54) SEMICONDUCTOR LIGHT EMITTING DEVICE AND METHOD FOR MANUFACTURING THE SAME

(75) Inventors: Kenji Kasahara, Tsukuba (JP); Kazumasa Ueda, Tsuchiura (JP)

(73) Assignee: Sumitomo Chemical Company, Ltd,, Tokyo (JP)

( * ) Notice: Subject to any disclaimer, the term of this patent is extended or adjusted under 35 U.S.C. 154(b) by 443 days.

(21) Appl. No.: 11/883,805

(22) PCT Filed: Feb. 16, 2006

(86) PCT No.: PCT/JP2006/303208

§ 371 (c)(1),
(2), (4) Date: Aug. 7, 2007

(87) PCT Pub. No.: WO2006/088228

PCT Pub. Date: Aug. 24, 2006

(65) Prior Publication Data

US 2008/0149952 A1    Jun. 26, 2008

(30) Foreign Application Priority Data

Feb. 18, 2005    (JP)    ............... 2005-041874

(51) Int. Cl.
*H01L 21/00* (2006.01)
*H01L 29/18* (2006.01)
(52) U.S. Cl. .................... 438/22; 257/98; 257/E33.062; 257/E33.002; 438/43
(58) Field of Classification Search ................ 257/103, 257/79, 91, 98, E33.002, 13, 94, 99, 88, E33.062; 438/22, 70, 34, 37, 39, 40, 28, 43, 706, 29
See application file for complete search history.

(56) References Cited

U.S. PATENT DOCUMENTS 6,504,180 B1    1/2003    Heremans et al.

(Continued)

FOREIGN PATENT DOCUMENTS

EP    1329961 A2    7/2003

(Continued)

OTHER PUBLICATIONS

Schnitzer et al., "30% external quantum efficiency from surface textured, thin-film light-emitting diodes", 1993, Appl. Phys. Lett., vol. 63, No. 16, pp. 2174-2176.*

(Continued)

*Primary Examiner*—Thomas L Dickey
*Assistant Examiner*—Nikolay Yushin
(74) *Attorney, Agent, or Firm*—Fitch, Even, Tabin & Flannery

(57) ABSTRACT

The present invention provides a semiconductor light emitting device and a method for manufacturing the same. The semiconductor device comprises (i) a semiconductor layer with convex portions in a shape selected from a cone and a truncated cone and (ii) electrodes, wherein in the case of the convex portions with the shape of the truncated cone, the convex portions has a height of from 0.05 to 5.0 μm and a bottom base diameter of from 0.05 to 2.0 μm; in case of the convex portions with the shape of the cone, the convex portions has a height of from 0.05 to 5.0 μm and a base diameter of from 0.05 to 2.0 μm. A method for manufacturing a semiconductor light emitting device comprising the steps of (a) growing a semiconductor layer on a substrate, (b) forming on the semiconductor layer a region having particles with an average particle diameter of 0.01 to 10 μm and a surface density of $2 \times 10^6$ to $2 \times 10^{10}$ cm$^{-2}$, and (c) dry-etching the semiconductor layer to form convex portions in the shape selected from a cone and a truncated corn.

18 Claims, 6 Drawing Sheets

U.S. PATENT DOCUMENTS

| | | | |
|---|---|---|---|
| 6,884,647 B2 * | 4/2005 | Sakai et al. | 438/30 |
| 6,921,924 B2 * | 7/2005 | Tsai et al. | 257/95 |
| 2003/0173568 A1 | 9/2003 | Asakawa et al. | |
| 2003/0178626 A1 | 9/2003 | Sugiyama et al. | |
| 2005/0112886 A1 * | 5/2005 | Asakawa et al. | 438/689 |
| 2007/0114511 A1 | 5/2007 | Kim et al. | |

FOREIGN PATENT DOCUMENTS

| | | | |
|---|---|---|---|
| JP | 10-200162 | * | 7/1998 |
| JP | 10-200162 A | | 7/1998 |
| JP | 2003-218383 A | | 7/2003 |
| JP | 2005/064113 A | | 3/2005 |
| JP | 2005-117006 A | | 4/2005 |

OTHER PUBLICATIONS

Quirk, "Semiconductor manufacturing technology", 2001, Prentice-Hall, pp. 35-353).*

Windisch et al., "40% Efficient Thin-Film Surface-Textured Light-Emitting Diodes by Optimization of Natural Lithography," IEEE Transactions on Electron Devices, Jul. 2000, vol. 47, No. 7, pp. 1492-1498.

Schnitzer et al., "30% External Quantum Efficiency from Surface Textured, Thin-Film Light-Emitting Diodes," Appl. Phys. Lett., vol. 63, No. 16, pp. 2174-2176, Oct. 18, 1993.

Examination Report issued on Feb. 25, 2010 in British Application No. 0718102.7.

* cited by examiner

Fig. 3
(a)
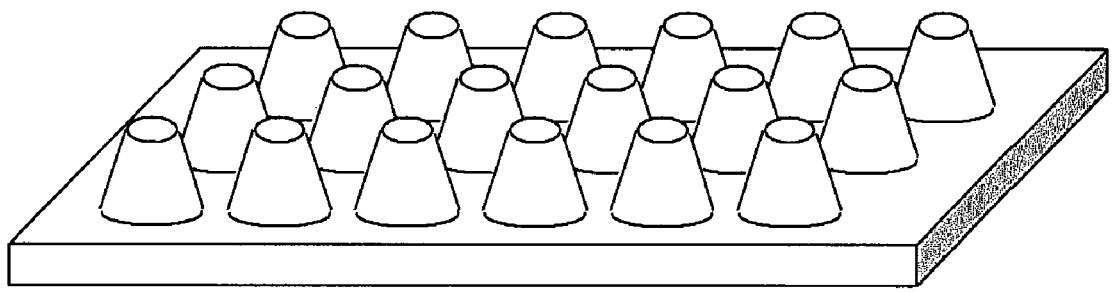
(b)
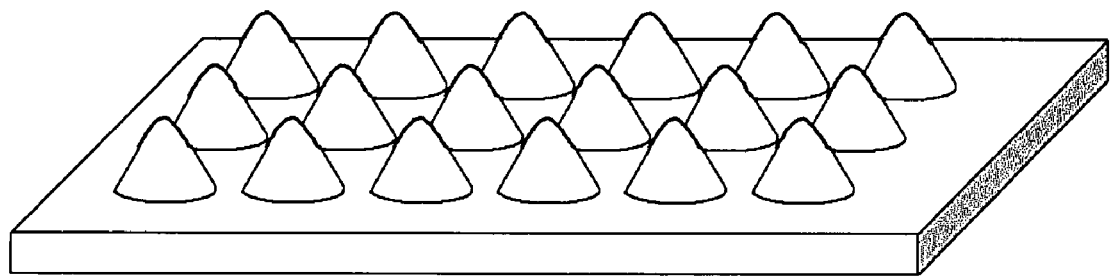

Fig. 6
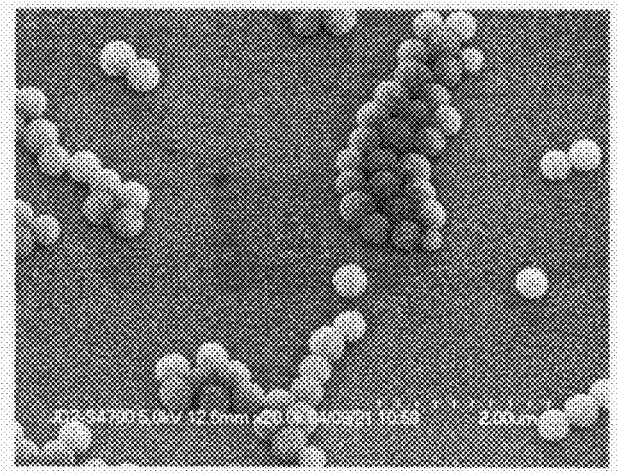
(a)
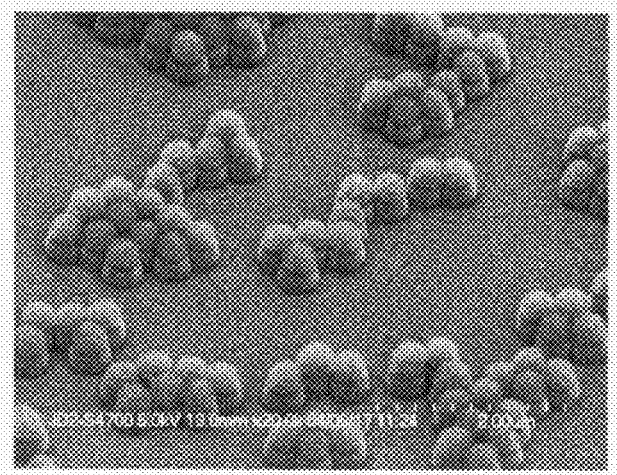
(b)
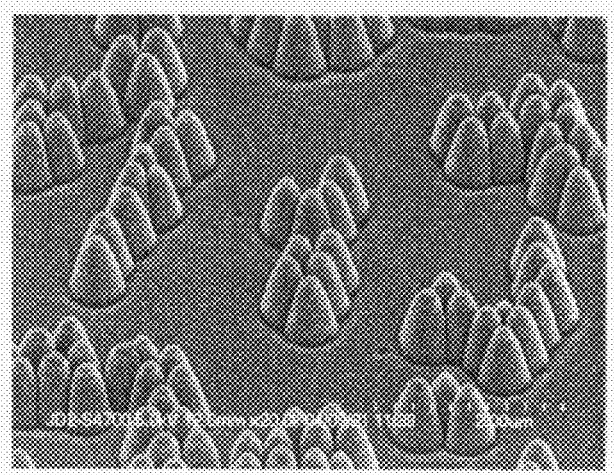
(c)

SEMICONDUCTOR LIGHT EMITTING DEVICE AND METHOD FOR MANUFACTURING THE SAME

This Application is the U.S. National Stage Application under 35 U.S.C. 371 of International Application PCT/JP/2006/303208 filed Feb. 16, 2006, which claims benefit from Japanese Patent Application No. 2005-041874 filed Feb. 18, 2005, the complete disclosures of which are incorporated herein by reference.

TECHNICAL FIELD

The present invention relates to a semiconductor light emitting device and a method for manufacturing the same.

BACKGROUND ART

As semiconductor light emitting devices used as light emitting diodes which emit ultraviolet, blue, or green light and laser diodes which emit ultraviolet, blue, or green light, for example, semiconductor light emitting devices are known which include a nitride-based compound semiconductor layer represented by the formula $In_xGa_yAl_zN$ ($x+y+z=1$, $0 \leq x \leq 1$, $0 \leq y \leq 1$, and $0 \leq z \leq 1$). The semiconductor light emitting devices include a substrate, a semiconductor layer, and electrodes and are manufactured by a method comprising the steps of stacking the semiconductor layer on the substrate by means of epitaxial growth and then forming the electrodes.

In viewpoint of increase in brightness of the semiconductor light emitting devices, a study of improvements in methods for manufacturing the semiconductor light emitting devices has been made. For example, a method has been proposed which comprises the steps of applying a block copolymer comprised of polystyrene and polymethyl methacrylate onto a semiconductor layer acting as the light output surface of a nitride semiconductor light emitting device, heating the copolymer layer to phase separate polystyrene (PS) and polymethyl methacrylate (PMMA) from the copolymer, removing PMMA by means of RIE (reactive ion etching) through the use of a difference in the rate of RIE between PS and PMMA, etching the light output surface of the semiconductor light emitting device by RIE and PS as a mask, removing PS to form conic convex portions in the light output surface, and then forming electrodes (see JP No. 2003-218383). However, it is required to develop a method for manufacturing a higher-brightness semiconductor light emitting device.

DISCLOSURE OF THE INVENTION

An object of the present invention is to provide a high-brightness semiconductor light emitting device and a method for manufacturing the device.

In order to solve the problem, the present inventors conducted extensive studies on a method for manufacturing a semiconductor light emitting device; as a result, the present invention has been accomplished.

That is, the present invention provides a method for manufacturing a semiconductor light emitting device comprising the steps of (a) growing a semiconductor layer on a substrate, (b) forming on the semiconductor layer a region having particles with an average particle diameter of 0.01 to 10 μm and a surface density of $2 \times 10^6$ to $2 \times 10^{10}$ $cm^{-2}$, and (c) dry-etching the semiconductor layer to form convex portions in a shape selected from a cone and a truncated corn.

Moreover, the invention provides a semiconductor light emitting device comprising the components of (i) a semiconductor layer with convex portions in a shape selected from a cone and the truncated cone and (ii) electrodes, and wherein in the case of the convex portions with the shape of the truncated cone, the convex portions has a height of from 0.05 to 5.0 μm and a bottom base diameter of from 0.05 to 2.0 μm; in case of the convex portions with the shape of the cone, the convex portions have a height of from 0.05 to 5.0 μm and a base diameter of from 0.05 to 2.0 μm.

BRIEF DESCRIPTION OF THE DRAWINGS

FIG. 3 shows the conceptual illustration (perspective view) of convex portions formed at step (c).

FIG. 6 shows electron microscope photographs of the surface of the semiconductor layer before, during, and after dry etching (observation at an angle of 45°).

Figure 1:
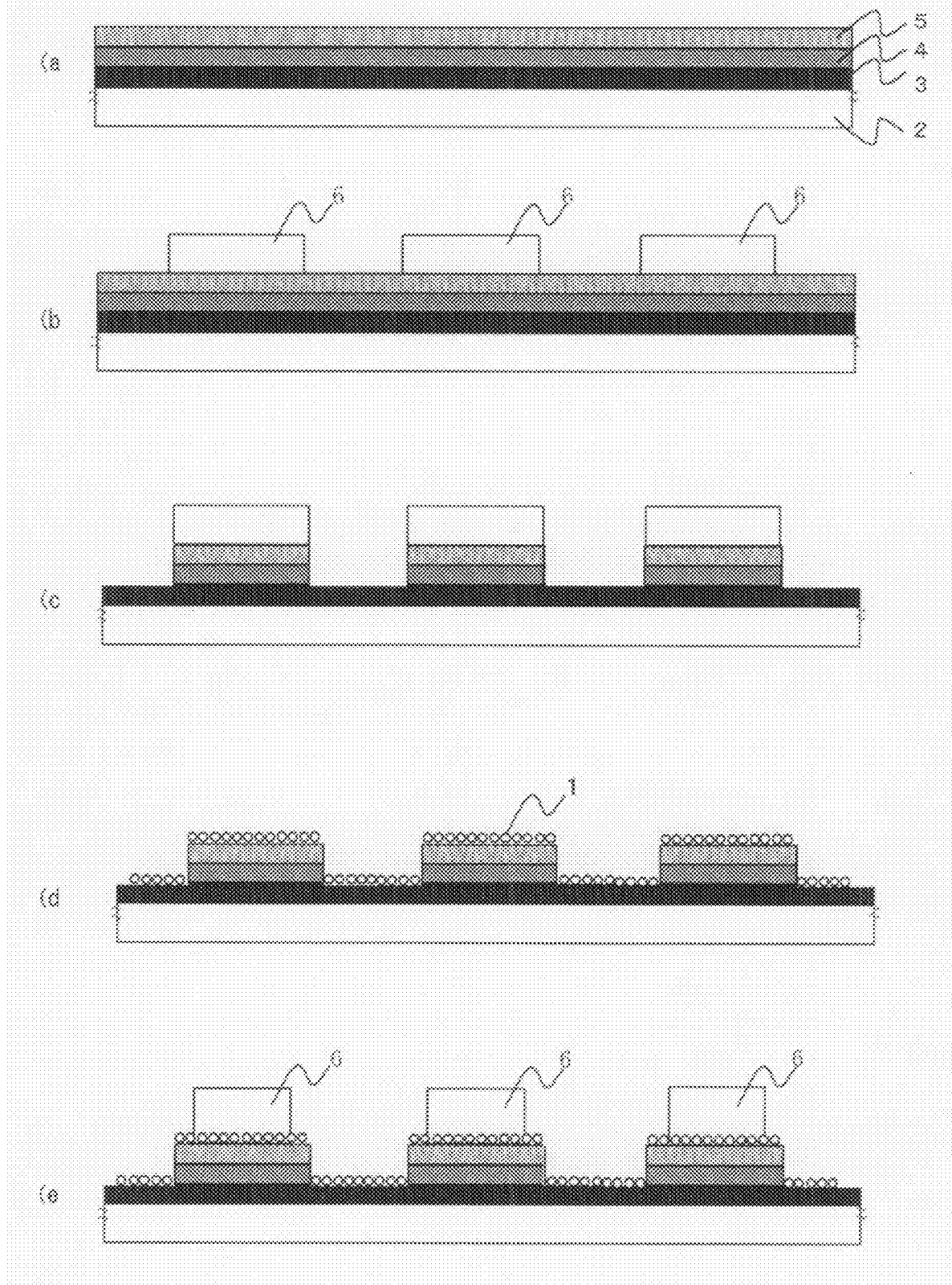
FIG. 1 shows the layer structure of the semiconductor at steps.

DESCRIPTION OF THE REFERENCE NUMERALS 1 particle
2 substrate
3 n-type contact layer
4 light emitting layer
5 p-type contact layer
6 resist
7 negative electrode
8 positive electrode
9 low-temperature buffer layer
10 n-type nitride-based compound semiconductor layer
11 AlGaN layer

MODE FOR CARRYING OUT THE INVENTION

A method for manufacturing a semiconductor light emitting device according to the present invention includes the step (a) of growing a semiconductor layer on a substrate.

The substrate is made of, for example, sapphire, SiC, Si, $MgAl_2O_4$, $LiTaO_3$, $ZrB_2$, $CrB_2$, or gallium nitride.

The semiconductor layer is made of, for example, a metal nitride, preferably a group III nitride represented by the formula $In_xGa_yAl_xN$ ($0 \leq x \leq 1$, $0 \leq y \leq 1$, $0 \leq z \leq 1$, and $x+y+z=1$). The semiconductor layer includes an n-type contact layer, a light emitting layer, and a p-type contact layer. When a group III nitride semiconductor is grown on the sapphire substrate, the semiconductor layer includes, for example, a low-temperature buffer layer, a n-type contact layer, a light emitting layer, and a p-type contact layer. The light emitting layer may have single quantum well structure or multiple quantum well structure.

The growth is carried out by means of, for example, metalorganic vapor phase epitaxy (MOVPE), molecular beam epitaxy (MBE), or hydride vapor phase epitaxy (HVPE) and preferably MOVPE or MBE.

When the group III nitride semiconductor is grown on the sapphire substrate by MOVPE, a growth temperature for the low-temperature buffer layer is usually from 400° C. to 600° C., a growth temperature for the n-type contact layer is usually from 800° C. to 1200° C., a growth temperature for the light emitting layer is usually from 600° C. to 800° C., and a growth temperature for the p-type contact layer is usually from 800° C. to 1200° C. The growth may be carried out by a method of charging a group III material (trimethylgallium (TMG), triethylgallium (TEG), trimethylaluminum (TMA), triethylaluminum (TEA), triisobutylaluminum, or the like) or a group V material (ammonia, hydrazine, or the like) into a reactor using a carrier gas (hydrogen gas, nitrogen gas, or the like). If necessary, a n-type dopant material (silane, disilane, germane, tetramethylgermanium, or the like) or a p-type dopant material (bis(cyclopentadiethyl)magnesium [$(C_5H_5)_2$ Mg], bis(methylcyclopentadiethyl)magnesium [$(C_5H_4CH_3)_2$ Mg], bis(ethylcyclopentadiethyl)magnesium [$(C_5H_4C_2H_5)_2$ Mg], or the like), together with the group III or V material, may be charged thereinto.

In the step (a), as shown in FIG. 1(a), the semiconductor layer may be grown on the sapphire single crystal substrate 2. The semiconductor layer includes the low-temperature buffer layer (not shown), the n-type contact layer 3, the light emitting layer 4, and the p-type contact layer 5.

The method according to the invention includes the step (b) of placing particles on the semiconductor layer obtained in the step (a).

The particles may be a substance is used as a mask in dry etching described below. The particles are made of organic substance or inorganic substance; preferably inorganic substance. The organic substance is for example polystyrene. The inorganic substance is for example oxide, nitride, carbide, boride, sulfide, or metal.

Examples of the oxide include silica, alumina, zirconia, titania, ceria, magnesia, zinc oxide, tin oxide, and yttrium aluminum garnet (YAG). Part of elements (other than oxygen) constituting each of those oxides may be substituted with another element.

Examples of the nitride include silicon nitride, aluminum nitride, and boron nitride. Part of elements (other than nitrogen) constituting each of those nitrides may be substituted with another element. Examples of the substituted compound include sialon with a structure made of silicon, aluminum, oxygen, and nitrogen.

Examples of the carbide include SiC, boron carbide, diamond, graphite, and fullerene. Part of elements (other than carbon) constituting each of those carbides may be substituted with another element.

Examples of the boride include $ZrB_2$ and $CrB_2$. Part of elements (other than boron) constituting each of those borides may be substituted with another element.

Examples of the sulfide include zinc sulfide, calcium sulfide, and strontium sulfide. Part of elements (other than sulfur) constituting each of those sulfides may be substituted with another element.

Examples of the metal include Si, Ni, W, Ta, Cr, Ti, Mg, Ca, Al, Au, Ag, and Zn.

The particles may be made of the above substance alone or combination thereof. Examples of the particles include oxide particles and mixture of oxide particles and nitride particles. Further, the particles may be covered with other particles. Examples of such particles include nitride particles covered with oxide particles.

The particles are made of preferably oxides, more preferably silica, further preferably silica contained in colloidal silica.

The particles have an average particle diameter of not less than 0.01 µm, preferably not less than 0.05 µm, further preferably not less than 0.1 µm, and not more than 10 µm, preferably not more than 2.0 µm, further preferably not more than 1.0 µm. The average particle diameter may be determined from an electron microscope photograph of the particles.

Figure 2:
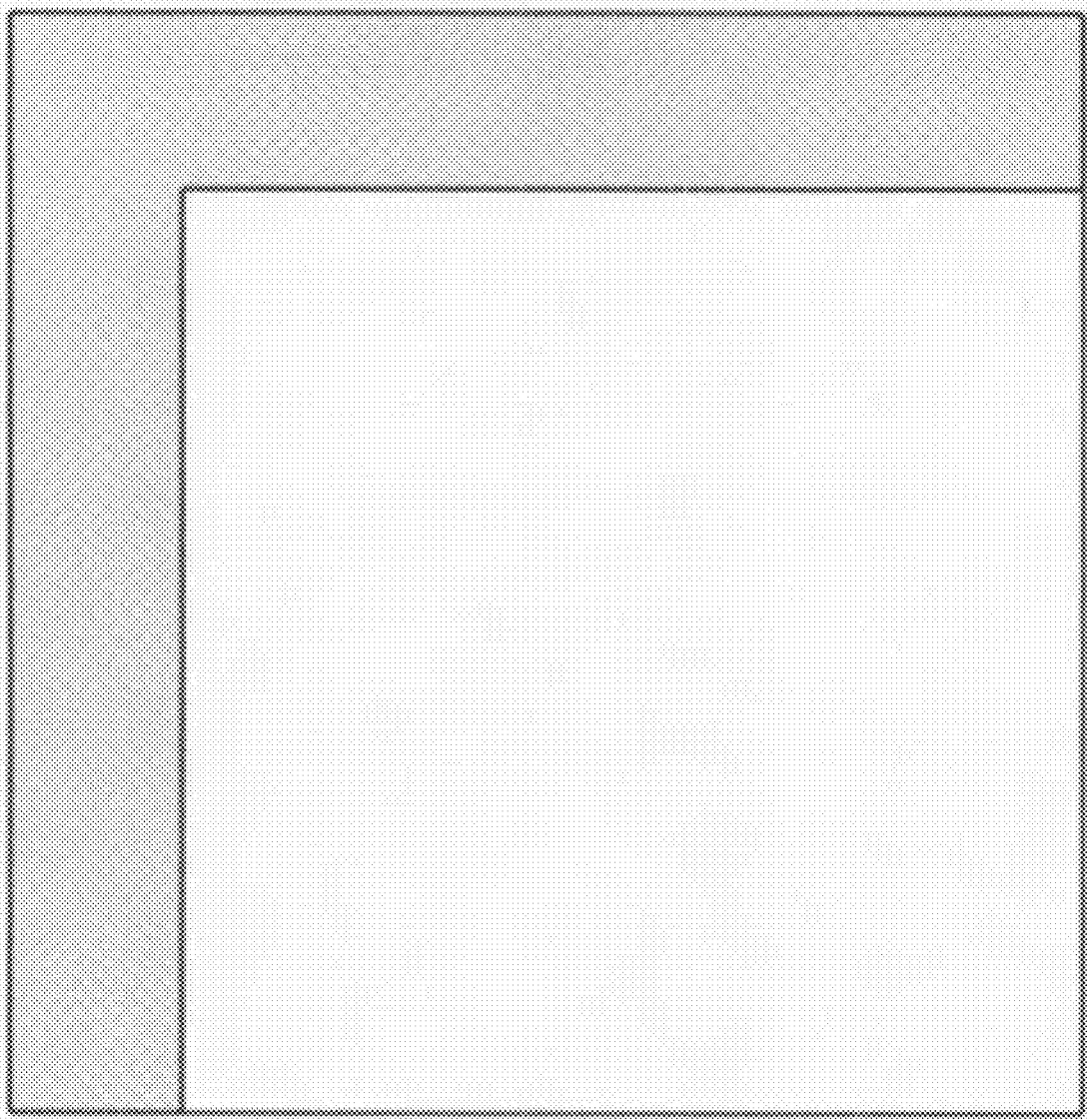
FIG. 2 shows the semiconductor layer (300 μm×300 μm) with the region (gray portion, width: 50 μm) in which particles are included.

The formation is carried out such that a region is obtained which has the particles described above and the particle surface density of not less than $2 \times 10^6$ cm$^{-2}$, preferably $2 \times 10^7$ cm$^{-2}$, and not more than $2 \times 10^{10}$ cm$^{-2}$, preferably not more than $2 \times 10^9$ cm$^{-2}$. The area and the shape of the region may be arbitrarily determined. The surface density is the number of the particles per unit area. For example, as shown in FIG. 2, when a semiconductor device has a square area of 300 µm×300 µm and 5000 particles in the 50 µm-wide region at the end of the semiconductor layer, the surface density is $2 \times 10^7$ cm$^{-2}$ [≈5000/[300 µm×300 µm−250 µm×250 µm]× $10^{-8}$ cm$^2$/µm$^2$]. The number of the particles may be determined from a scanning electron microscope photograph of the region formed on the semiconductor layer. The surface density may be usually determined from the area of any given section (for example, a section in which not less than 100 particles are placed) of the region provided on the semiconductor layer and the number of the particles determined from the electron microscope photograph.

The formation may be carried out by, for example, a method of dispersing the particles into a solvent (such as water) to obtain a slurry, dipping the substrate on which the semiconductor layer has been grown in the slurry, or applying or spraying the slurry onto the substrate, and drying the substrate. The formation may be preferably carried out by a method of applying the slurry onto the substrate by means of spin coating and then drying the slurry. Using spin coating, the particles may be placed more uniformly. In the method of applying or spraying the slurry, the surface density may be controlled by, for example, adjusting the concentration of the slurry, the amount of the slurry to be applied, or the amount of the slurry to be sprayed. When the surface density is controlled by adjusting the slurry concentration, the concentration of the slurry in the solvent (water) may be adjusted within the range of not less than 0.1% by weight, preferably not less than 1% by weight, further preferably not less than 10% by weight, and not more than 30% by weight, preferably not more than 20% by weight.

The method according to the invention further includes step (c) of dry-etching the semiconductor layer to form convex portions with a shape selected from tapered and pointed solid and tapered and truncated solid. Examples of the tapered and pointed solid include cone and pyramid, preferably cone. Example of the tapered and truncated solid include truncated cone and truncated pyramid,; preferably truncated cone.

The dry etching may be carried out by ECR dry etching or ICP dry etching. The dry etching step includes a sub step of etching the semiconductor layer by using the particles placed in the region formed in the step (b) as a mask.

The dry etching is preferably carried out under the condition that the maximum diameter (hereinafter abbreviated as "$D_{MAX}$") of the particles is reduced in a direction parallel to the surface of the substrate while etching the semiconductor layer. For example, the dry etching is carried out such that $D_{MAX}$ after the etching step is preferably not more than 80% of the average particle diameter of the particles before the etching step and is more preferably not more than 50%.

The dry etching is carried out such that the convex portions preferably have the shape of (i) the cone or (ii) the truncated cone in which the area of its top base is not more than 25% of its bottom base (on the substrate side of the convex portions) and more preferably have the shape of (i) the cone.

When the convex portions have the shape of the cone, the convex portions have a height of usually not less than 0.05 µm, not more than 5.0 µm and a diameter of the base of usually not less than 0.05 and not more than 2.0 µm.

When the convex portions have the shape of the truncated cone, the convex portions have a height of usually not less than 0.05 µm and not more than 5.0 µm and a diameter of the bottom base of usually not less than 0.05 µm and not more than 2.0 µm.

For example, when the dry etching is carried out for 7.5 minutes under the following condition A, the semiconductor (GaN) layer is etched by about 0.6 µm in a direction perpendicular to the substrate surface.

Condition A:
semiconductor layer: GaN,
particles (Mask): spherical Silica with an average particle diameter of 0.37 µm,
substrate bias power: 100 W,
ICP power: 200 W,
pressure: 0.8 Pa,
chlorine gas: 20 sccm,
dichloromethane: 10 sccm, and
argon: 40 sccm.

$D_{MAX}$ of the silica is reduced to about 0.18 µm on average and therefore reaches about 50% of their average particle diameter before the dry etching. Under the condition, convex portions in the shape of a truncated cone are formed under the silica as shown in FIG. 3(a). The convex portions are formed of GaN. Then the dry etching conditions are changed, the silica is etched until it becomes nonexistent almost completely as shown in FIG. 3(b), by which convex portions in the shape of a cone are formed.

When the dry etching is carried out under the following condition B, the semiconductor (GaN) layer is hardly etched but only silica is etched.

Condition B:
semiconductor layer: GaN,
particles (Mask): spherical silica with an average particle diameter of 0.37 µm,
substrate bias power: 100 W,
ICP power: 200 W,
pressure: 0.8 Pa, and
$CHF_3$: 100 sccm.

When the dry etching is carried out under condition A as described above, both semiconductor (GaN) layer and silica are etched. When the dry etching steps under condition A and condition B is alternately repeated at proper time intervals, the tilt angle of the side wall of formed convex portions is less than the side wall of the convex portions formed by conducting the etching step under condition A.

When the dry etching is carried out under the following condition C (that is identical with condition A except that the amount of argon is reduced), the ratio of an etching rate for the silica to the semiconductor (GaN) layer is small. The tilt angle of the side wall of convex portions formed by carrying the etching step under condition C is greater than the side wall of the convex portions formed by carrying the etching step under condition A.

Condition C:
substrate bias power: 100 W,
ICP power: 200 W,
pressure: 0.8 Pa,
chlorine gas: 20 sccm,
dichloromethane: 10 sccm, and
argon: 0 sccm.

After the dry etching, the particles may be left on the tips of the convex portions. When the surfaces of the convex portions are covered with an electrode film, it is preferable to remove the left particles before the formation of the electrode film. The removal may be carried out by, for example, dissolving the particles (such as silica particles) in a hydrofluoric acid.

The method according to the invention may include the step (d) of forming an electrode.

When the electrode is a positive electrode, the positive electrode is made of a metal such as Au, Pt, Pd and NiAu, or ITO. When the semiconductor layer (the p-type contact layer) is made of the group III nitride, the positive electrode is preferably made of NiAu or ITO. When the electrode is a negative electrode, the negative electrode is made of an alloy or a compound containing at least one selected from the group consisting of Al, Ti, and V as a main component(s) and preferably made of Al, TiAl or VAl. For example, a resist is patterned by photolithography, an electrode material is deposited by vacuum deposition, and then the electrode is formed by lift-off.

Heat treatment may be carried out after the electrode formation. According to the heat treatment, ohmic contact is made between the electrode and the contact layer. When the electrode is made of Ti, heat treatment is usually carried out. With the formation of the positive electrode, conditions for the heat treatment depend on the type of the electrode material and the concentration of holes in the p-type contact layer, and for example, the heat treatment may be carried out under the atmosphere of a mixture of nitrogen and oxygen, at a temperature of 400° C. to 800° C. for a period of 0.1 to 60 minutes. With the formation of the negative electrode, conditions for the heat treatment depend on the type of the electrode material and the concentration of electrons in the n-type contact layer, and for example, the heat treatment may be carried out under the nitrogen atmosphere, at a temperature of 500° C. to 800° C. for a period of 0.1 to 60 minutes.

Figure 4:
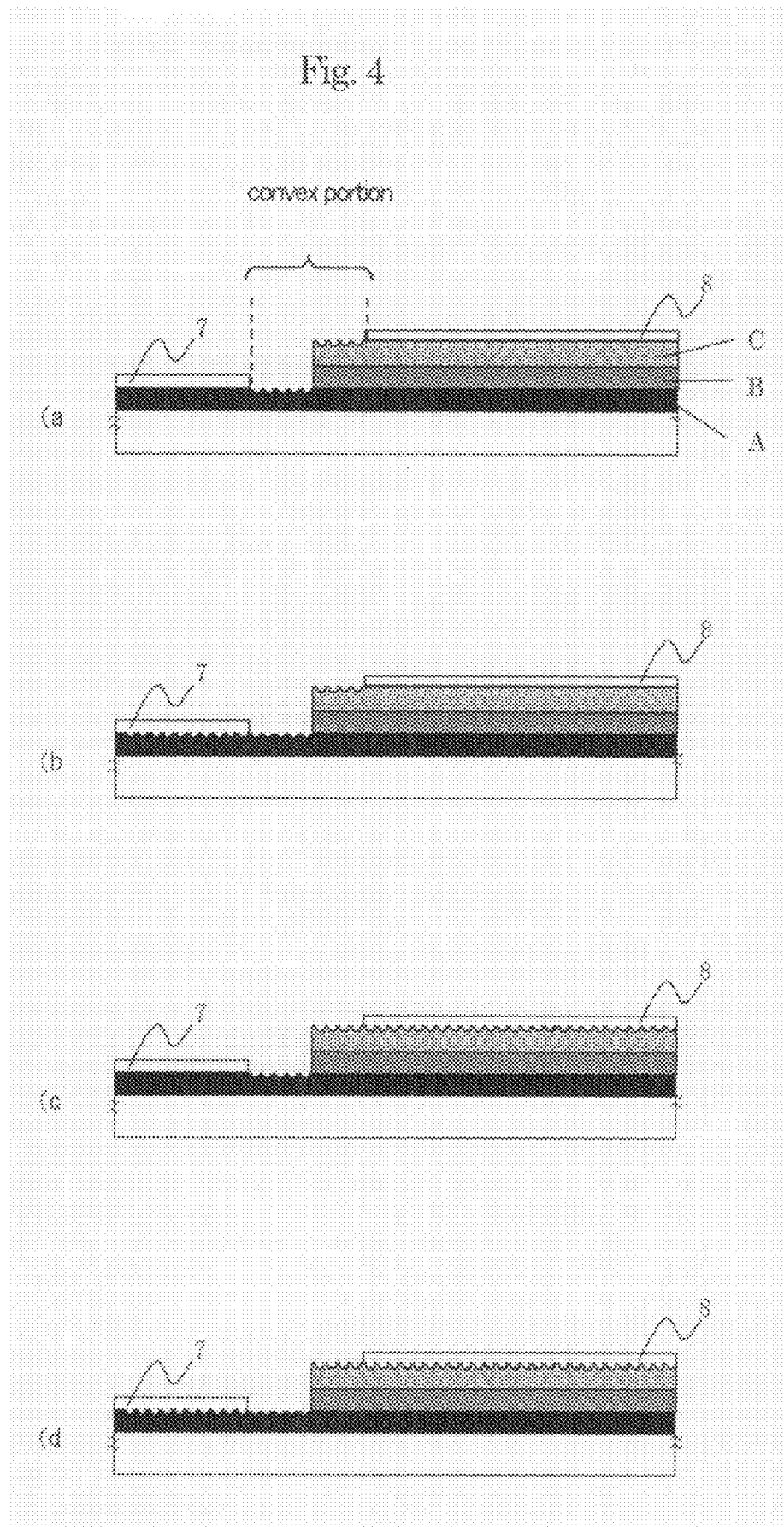
FIG. 4 shows the convex portions formed at step (c)

After step (b) (see FIG. 1(d)), the method according to the invention may include the step (e) of forming resist film on the semiconductor layer and patterning the resist film into a predetermined shape by photolithography. (see FIG. 1(e)), and step (c) is carried out and then removing the resist from the portion covered with the resist film (the portion where no convex portion is formed). According to the step (e), no convex portion is formed in the semiconductor layer under the electrode, which makes it possible to obtain the semiconductor light emitting device in which contact resistance between the electrode and the semiconductor layer is reduced. In FIG. 4(a), no convex portion is formed in semiconductor layer A under a negative electrode 7 and semiconductor layer C under a positive electrode 8. In FIG. 4(b), no convex portion is formed in semiconductor layer C under the positive electrode 8. In FIG. 4(c), no convex portion is formed in semiconductor layer A under the negative electrode 7. FIG. 4(d) shows an embodiment where the convex portions are formed in semiconductor layer A under the negative electrode 7 and semiconductor layer C under the positive electrode 8 (an embodiment of the formation of the convex portions which are arbitrarily formed irrespective of the inside or the outside of the electrode region).

Moreover, the method according to the invention may include the step (f) of covering a convex portion with a transparent electrode film. According to step (f), for example, the resist patterning on the p-type contact layer 5 is carried out by photolithography, an electrode material is deposited by vapor deposition, and then the transparent positive electrode is formed by lift-off.

Furthermore, the method according to the invention may include the step of forming a mesa-shaped portion by dry etching using an ICP dry etching apparatus until the n-type contact layer 3 is exposed. In the step of forming the mesa-shaped portion, a resist 6 is patterned by photolithography (see FIG. 1(b)) and the semiconductor layer is dry-etched using the resist 6 as a mask (see FIG. 1(c)).

In the formation of the mesa-shaped portion, examples of the order of the steps of (i) forming the mesa-shaped portion, (ii) forming the convex portions, (iii) forming the positive electrode and (iv) forming the negative electrode, include the steps of (iii)→(ii)→(i)→(iv), and steps of (i)→(iii)→(ii)→(iv).

According to the above method, the micro convex portions, side wall of which is not perpendicular to the substrate surface and shape of which is the truncated cone or the cone, are formed at least one of the semiconductor layers.

For example, a semiconductor device having (i) the semiconductor layer with the convex portions in the shape selected from the cone and the truncated cone and (ii) the electrodes, and wherein in the case of the convex portions with the shape of the truncated cone, the convex portions has a height of from 0.05 to 5.0 μm and a diameter of their bottom base of from 0.05 to 2.0 μm; in case of the convex portions with the shape of the cone, the convex portions has a height of from 0.05 to 5.0 μm and a diameter of their base of from 0.05 to 2.0 μm, may be obtained by the method including steps of (a), (b), and (c) described above and optional steps (d), (e), and (f).

When the vertex of the individual convex portions of the semiconductor layer is divided in a direction perpendicular to a light output surface, it is preferable that a line showing the outer edge of the cross section of the convex portions have at least two curved portions and a radius of curvature of the curved portions on the base side of the convex portions be larger than the curved portion on their vertex side. For example, the shape of a stalagmite or the like is preferably formed as their cross section. Examples of the semiconductor layer with the convex portions include low-temperature buffer layer, n-type contact layer, light emitting layer, and p-type contact layer, preferably p-type contact layer.

EXAMPLES

The following examples will illustrate the present invention more in detail, but do not limit the scope of the invention.

Example 1

Growth of Semiconductor Layer Using MOVPE

A GaN buffer layer 9 with a thickness of 50 nm was grown on the sapphire substrate 2 at a growth temperature of 530° C. An n-type GaN contact layer 3 with a thickness of 4 μm and a n-type dopant concentration of $2\times10^{18}$ cm$^{-3}$ was grown on the GaN buffer layer 9 at a growth temperature of 1110° C. using disilane as a dopant material and adjusting the flow rate of the disilane.

An n-type GaN layer 10 with a thickness of 100 nm and a n-type carrier concentration of $5\times10^{17}$ cm$^{-3}$ was grown on the n-type contact layer 3 at a growth temperature of 1120° C.

A light emitting layer 4 with a multiple quantum well structure having GaN barrier layers 4A to 4F with a thickness of 15 nm and $In_{0.12}Ga_{0.88}N$ well layers 4G to 4K with a thickness of 3 nm, was grown on the n-type GaN layer 10.

A magnesium-doped AlGaN layer 11 with a thickness of 30 nm was grown on the light emitting layer 4 under conditions that biscyclopentadiethyl magnesium [$(C_5H_5)_2Mg$] is used as a p-type dopant material and a growth temperature is 940° C.

Figure 5:
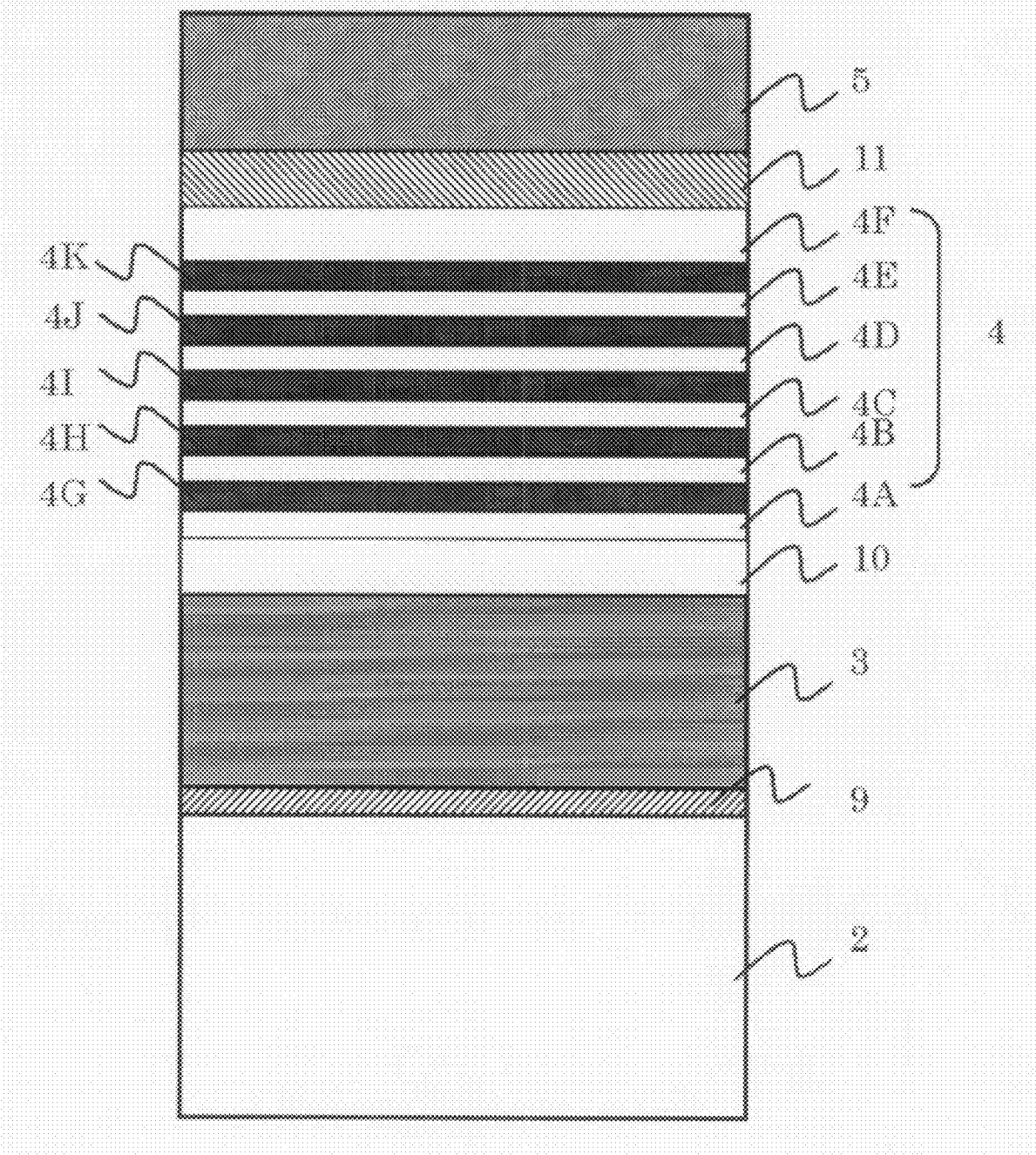
FIG. 5 shows the layer structure of the nitride semiconductor layer obtained in Example 1.

A p-type GaN layer 5 with a thickness of 200 nm was grown on the magnesium-doped AlGaN layer 11 under conditions that biscyclopentadiethyl magnesium is used as a p-type dopant material and a growth temperature is 1010° C. and then heat-treated under a nitrogen atmosphere at 700° C. for 20 minutes to grow a nitride-based compound semiconductor layer having a structure shown in FIG. 5.

A transparent positive electrode 8 (not shown) was formed on the p-type contact layer 5. In order to wash the surface of the p-type contact layer, the layer was immersed in hot aqua regia for 10 minutes.

A resist was patterned by photolithography. A Ni layer with a thickness of 15 nm and a Au layer with a thickness of 28 nm were formed by vacuum deposition, and a positive electrode was formed by lift-off, and then heat-treated was carried out under the atmosphere of mixture of nitrogen and oxygen at 500° C. for 10 minutes.

[Formation of Region Containing Particles]

A region containing silica particles was formed on the p-type contact layer by applying a colloidal silica slurry (silica concentration: 10 wt %) onto the exposed surface (on which no electrode is formed) of the p-type contact layer by spin coating. As the particles, silica particles included in the colloidal silica slurry (Trade Name "PL-20", manufactured by Fuso Chemical Co., Ltd., average particle diameter: 370 nm, the average particle diameter was determined from SEM photo) were used. The particle density was determined from the SEM photo of the region formed on the p-type contact layer. As a result, the particle density was $3\times10^8$ cm$^{-2}$.

[Dry Etching]

The nitride semiconductor layer was dry-etched using an ICP dry etching apparatus and silica as a mask under the following conditions to form convex portions, giving a semiconductor light emitting device.

Conditions:
substrate bias power: 100 W,
ICP power: 200 W,
pressure: 0.8 Pa,
chlorine gas: 20 sccm,
dichloromethane: 10 sccm,
argon: 40 sccm, and
time: 7.5 min.

According to the dry etching, the nitride semiconductor layer was etched by 0.6 μm in a direction perpendicular to the substrate surface. After the dry etching, the silica particles had a $D_{MAX}$ of 0.18 μm, which is about 50% of the diameter of the silica particles before the dry etching. SEM photos of the nitride semiconductor layer taken before, during, and after the dry etching were shown in FIGS. 6(a), 6(b), and 6(c), respectively.

The convex portions had the shape of the truncated corn and their tips were covered with the silica. The diameter of the bottom base of the truncated corn was 0.4 μm. The area of the top base of the truncated corn was from 4% to 16% of the area of the bottom base.

A resist was patterned on the p-type contact layer 5 by photolithography. The semiconductor layers were etched by 1.7 μm by ICP dry etching, by which the n-type contact layer 3 was exposed and mesa-shaped portions were formed. The resist was removed.

A resist was patterned on the n-type contact layer 3 by photolithography, following which an Al metal layer with a thickness of 100 nm was formed by vacuum deposition.

Thereafter, a negative electrode 7 was formed by lift-off of the resist to obtain a semiconductor light emitting device.

[Evaluation of Light Output of Semiconductor Light Emitting Device]

A forward current of 20 mA was fed to the semiconductor light emitting device having a diode structure to emit light. The semiconductor light emitting device had the light emitting region in the form of circle with a diameter of 200 μm and concave portions around the perimeter of the region. A photodiode with a light receiving area of 78.5 mm² was arranged at the height of 51.5 mm directly above the light emitting device to measure light output. The main conditions of manufacturing were shown in Table 1. The evaluation results of the semiconductor light emitting devices were shown in table 2.

Example 2

The same operation as the section "Growth of Semiconductor Layer Using MOVPE" of Example 1 was conducted. Except that a colloidal silica slurry, which was prepared by adjusting the silica concentration of a colloidal silica slurry (Trade Name "PL-5", manufactured by Fuso Chemical Co., Ltd., average particle diameter of silica particles: 110 nm) to 2 wt %, was used, the same operation as the section "Formation of Region in Which Particles Are Included" of Example 1 was conducted. The density of the particles in this example was $6 \times 10^9$ cm$^{-2}$.

The obtained nitride semiconductor layer was dry-etched using an ICP dry etching apparatus and silica as a mask under the following conditions to form convex portions.

Conditions:
substrate bias power: 100 W,
ICP power: 200 W,
pressure: 0.8 Pa,
chlorine gas: 20 sccm,
dichloromethane: 10 sccm,
argon: 40 sccm, and
time: 2.5 min.

The nitride semiconductor layer was dry-etched by 0.2 μm in a direction perpendicular to the substrate surface. According to the dry etching, the silica particles had a $D_{MAX}$ of 0.05 μm, which was about 50% of the diameter of the silica particles before the dry etching.

The silica particles were removed by wet etching using a buffered hydrofluoric acid. In this example, convex portions in the shape of the truncated cone and convex portions in the shape of the cone were formed together.

A resist was patterned on the p-type contact layer 5 by photolithography. The semiconductor layer was etched by 1.7 μm by ICP dry etching, by which the n-type contact layer 3 was exposed and mesa-shaped portions were formed. The resist was removed.

A resist was patterned on the n-type contact layer 3 by photolithography, following which a Al metal layer with a thickness of 100 nm was formed by vacuum deposition. The negative electrode 7 was formed by lift-off of the resist to obtain a semiconductor light emitting device. The semiconductor light emitting device was evaluated for its properties under the same conditions as Example 1. The main conditions of manufacturing were shown in Table 1. The evaluation results of the semiconductor light emitting device was shown in Table 2.

Comparative Example 1

Except that no region containing silica particles was formed and no convex portion were formed, The same operation as Example 1 was conducted to obtain a semiconductor light emitting device. The semiconductor light emitting device was evaluated under the same conditions as Example 1. The results were shown in Table 2.

TABLE 1

| | MANUFACTURING CONDITIONS | | | | | |
|---|---|---|---|---|---|---|
| | Particle | | | Concave Portion | | |
| | Component | Average Particle Diameter (μm) | Surface Density (cm$^{-2}$) | Shape | Height (μm) | Average Diameter of Bottom Base (μm) |
| Example 1 | Silica | 0.37 | $3 \times 10^8$ | Truncated Corn | 0.6 | 0.4 |
| Example 2 | Silica | 0.11 | $6 \times 10^9$ | Truncated Corn | 0.2 | 0.1 |

TABLE 2

| PRODUCT PROPERTIES | |
|---|---|
| | Light Output (mW) |
| Example 1 | 8.0 |
| Example 2 | 8.0 |
| Comparative Example 1 | 3.4 |

* In Examples 1 and 2 and Comparative Example 1, the semiconductor substrate which was obtained by the method described in the section "Growth of Semiconductor Layer Using MOVPE" were divided to fabricate devices in order to compare their properties.

Example 3

The same operation as the section "Growth of Semiconductor Layer Using MOVPE" of Example 1 was conducted. Except that a colloidal silica slurry, which was prepared by adjusting the silica concentration of the colloidal silica slurry (Trade Name "PL-20", manufactured by Fuso Chemical Co., Ltd., average particle diameter of silica particles: 370 nm) to 15 wt %, was used, the same operation as the sections "Formation of Region in Which Particles Are Included" and "Dry Etching" of Example 1 were conducted. In this example, the particle density was $9 \times 10^8$ cm$^{-2}$.

The obtained semiconductor light emitting device was evaluated under the same conditions as the section "Evaluation of Light Output of Semiconductor Light emitting device" of Example 1. The main manufacturing conditions were shown in Table 3. The evaluation results of the semiconductor light emitting device were shown in Table 4.

Example 4

The same operation as the section "Growth of Semiconductor Layer Using MOVPE" of Example 1 was conducted.

A colloidal silica slurry (silica concentration: 10 wt %) was applied onto the obtained p-type contact layer by spin coating to form a region containing silica particles on the p-type contact layer. As the particles, silica particles in a colloidal silica slurry (Trade Name "KE-W50", manufactured by Nippon Shokubai Co., Ltd., average particle diameter of silica particles: 550 nm) were used. In this example, the particle density was $2 \times 10^8$ cm$^{-2}$.

Except that the dry etching time was changed to 10 minutes, the same operation as the section "Dry etching" of Example 1 was conducted to obtain a semiconductor light emitting device. In this example, the nitride semiconductor layer was dry-etched by 0.9 μm in a direction perpendicular to the substrate surface. The silica particles had a $D_{MAX}$ of 0.3 μm, which was about 55% of the diameter of the silica particles before the dry etching.

The obtained semiconductor light emitting device was evaluated under the same conditions as the section "Evaluation of Light Output of Semiconductor Light emitting device" of Example 1. The main manufacturing conditions were shown in Table 3. The evaluation result of the semiconductor light emitting device were shown in Table 4.

Comparative Example 2

Except that no region containing silica particles was formed and no convex portion were formed, The same operation as Example 3 was conducted to obtain a semiconductor light emitting device. The semiconductor light emitting device was evaluated under the same conditions as Example 1. The results were shown in Table 2.

TABLE 3

MANUFACTURING CONDITIONS

| | | Particle | | Concave Portion | | |
|---|---|---|---|---|---|---|
| | Component | Average Particle Diameter (μm) | Surface Density (cm$^{-2}$) | Shape | Height (μm) | Average Diameter of Bottom Base (μm) |
| Example 3 | Silica | 0.37 | $9 \times 10^8$ | Truncated Corn | 0.6 | 0.4 |
| Example 4 | Silica | 0.55 | $2 \times 10^8$ | Truncated Corn | 0.9 | 0.6 |

TABLE 4

PRODUCT PROPERTIES

| | Light Output (mW) |
|---|---|
| Example 3 | 12.7 |
| Example 4 | 10.1 |
| Comparative Example 2 | 5.5 |

* In Examples 3 and 4 and Comparative Example 2, the semiconductor substrate obtained by the method described in the section "Growth of Semiconductor Layer Using MOVPE" was divided to fabricate the devices in order to compare their properties.

INDUSTRIAL FIELD OF APPLICATION

According to the method for manufacturing a semiconductor light emitting device of the present invention, a high-brightness semiconductor light emitting device is provided. The semiconductor light emitting device can be suitably used as a light emitting diode device that emits ultraviolet, blue, or green light or a laser diode device that emits ultraviolet, blue, or green light.

The invention claimed is:

1. A method for manufacturing a semiconductor light emitting device comprising (i) a semiconductor layer with convex portions in a shape selected from a cone and a truncated cone and (ii) electrodes, said method comprising the steps of:
    (a) growing a semiconductor layer on a substrate,
    (b) forming on the semiconductor layer a region having particles with an average particle diameter of 0.01 to 10 μm and a surface density of $2 \times 10^6$ to $2 \times 10^{10}$ cm$^{-2}$, and
    (c) dry-etching the semiconductor layer to form the convex portions in the shape selected from a cone and a truncated cone,
    wherein the semiconductor layer is made of metal nitride, and
    wherein in the case of the convex portions with the shape of the truncated cone, the convex portions have a height of from 0.05 to 5.0 μm and a bottom base diameter of from 0.05 to 2.0 μm; in case of the convex portions with the shape of the cone, the convex portions have a height of from 0.05 to 5.0 μm and a base diameter of from 0.05 to 2.0 μm.

2. The method according to claim 1, wherein the semiconductor layer is made of group III nitride.

3. The method according to claim 1, wherein the growth is carried out by metalorganic vapor phase epitaxy, molecular-beam epitaxy, or hydride vapor phase epitaxy.

4. The method according to claim 1, wherein the particles are made of an organic substance on an inorganic substance.

5. The method according to claim 4, wherein the inorganic substance is at least one selected from the group consisting of oxide, nitride, carbide, boride, sulfide, and metal.

6. The method according to claim 5, wherein the oxide is at least one selected from the group consisting of silica, alumina, zirconia, titania, ceria, magnesia, zinc oxide, tin oxide, and yttrium aluminum garnet.

7. The method according to claim 5, wherein the oxide is silica.

8. The method according to claim 5, wherein the metal is at least one selected from the group consisting of Si, Ni, W, Ta, Cr, Ti, Mg, Ca, Al, Au, Ag, and Zn.

9. The method according to claim 1, wherein the top base area of the truncated cones formed in the step (c) is not more than 25% of the bottom base area of the truncated cones.

10. The method according to claim 1, wherein the truncated cones formed in the step (c) have a height of from 0.05 to 5.0 μm and bottom base diameter of the truncated cones from 0.05 to 2.0 μm.

11. The method according to claim 1, wherein the cones formed in the step (c) have a height of from 0.05 to 5.0 μm and a base diameter of the cones of from 0.05 to 2.0 μm.

12. The method according to claim 1, further comprising the step (e) of forming resist film on the semiconductor layer and patterning the resist film on the semiconductor layer and patterning the resist film into a predetermined shape by photolithography after the step (b), and removing the resist from the portion covered with the resist film after step (c).

13. The method according to claim 1, further comprising step (f) of covering the convex portions with a transparent electrode film after step (c).

14. A method for manufacturing a semiconductor light emitting device comprising (i) a semiconductor layer with convex portions in a shape selected from a cone and a truncated cone and (ii) electrodes, said method comprising the steps of:
(a) growing a semiconductor layer on a substrate,
(b) forming on the semiconductor layer a region having particles with an average particle diameter of 0.01 to 10 μm and a surface density of $2\times10^6$ to $2\times10^{10}$ $cm^{-2}$, and
(c) dry-etching the semiconductor layer to form the convex portions in the shape selected from a cone and a truncated cone,
wherein the dry etching is carried out until the maximum diameter of the particles is not more than 80% of the average particle diameter of the particles before dry-etching in a direction parallel to the surface of the substrate, and
wherein in the case of the convex portions with the shape of the truncated cone, the convex portions have a height of from 0.05 to 5.0 μm and a bottom base diameter of from 0.05 to 2.0 μm; in case of the convex portions with the shape of the cone, the convex portions have a height of from 0.05 to 5.0 μm and a base diameter of from 0.05 to 2.0 μm.

15. A method for manufacturing a semiconductor light emitting device comprising (i) a semiconductor layer with convex portions in a shape selected from a cone and a truncated cone and (ii) electrodes, said method comprising the steps of:
(a) growing a semiconductor layer on a substrate,
(b) forming on the semiconductor layer a region having particles with an average particle diameter of 0.01 to 10 μm and a surface density of $2\times10^6$ to $2\times10^{10}$ $cm^{-2}$, and
(c) dry-etching the semiconductor layer to form the convex portions in the shape selected from a cone and a truncated cone,
wherein the substrate is made of at least one selected from the group consisting of sapphire, SiC, Si, $MgAl_2O_4$, $LiTaO_3$, $ZrB_2$, $CrB_2$, and gallium nitride, and
wherein in the case of the convex portions with the shape of the truncated cone, the convex portions have a height of from 0.05 to 5.0 μm and a bottom base diameter of from 0.05 to 2.0 μm; in case of the convex portions with the shape of the cone, the convex portions have a height of from 0.05 to 5.0 μm and a base diameter of from 0.05 to 2.0 μm.

16. A semiconductor device comprising (i) a semiconductor layer with convex portions in a shape selected from a cone and a truncated cone and (ii) electrodes,
wherein in the case of the convex portions with the shape of the truncated cone, the convex portions have a height of from 0.05 to 5.0 μm and a bottom base diameter of from 0.05 to 2.0 μm; in case of the convex portions with the shape of the cone, the convex portions have a height of from 0.05 to 5.0 μm and a base diameter of from 0.05 to 2.0 μm, and
wherein when the vertex of the individual convex portions of the semiconductor layer is divided in a direction perpendicular to a light output surface, a line showing the outer edge of the cross section of the convex portions have at least two curved portions and a radius of curvature of the curved portions on the base side of the convex portions be larger than the curved portion on their vertex side.

17. The semiconductor device according to claim 16, wherein the semiconductor layer is selected from the group consisting of low-temperature buffer layer, n-type contact layer, light emitting layer, and p-type contact layer.

18. The semiconductor device according to claim 17, wherein the semiconductor layer is the p-type contact layer.

* * * * *